United States Patent [19]
Sakemi et al.

[11] Patent Number: 6,021,737
[45] Date of Patent: Feb. 8, 2000

[54] ION PLATING APPARATUS THAT PREVENTS WASTEFUL CONSUMPTION OF EVAPORATION MATERIAL

[75] Inventors: Toshiyuki Sakemi; Masaru Tanaka, both of Niihama, Japan

[73] Assignee: Sumitomo Heavy Industries, Ltd., Tokyo, Japan

[21] Appl. No.: 08/985,776

[22] Filed: Dec. 5, 1997

[30] Foreign Application Priority Data

Dec. 17, 1996 [JP] Japan .................................. 8-336560

[51] Int. Cl.[7] .................................................. C23C 16/00
[52] U.S. Cl. ............................... 118/723 E; 118/723 VE; 204/298.04
[58] Field of Search ......................... 118/723 VE, 723 E, 118/723 MA; 204/298.04, 298.05

[56] References Cited

U.S. PATENT DOCUMENTS

| | | | |
|---|---|---|---|
| 5,055,169 | 10/1991 | Hock, Jr. et al. | 204/192.31 |
| 5,656,138 | 8/1997 | Scobey et al. | 204/192.12 |
| 5,677,012 | 10/1997 | Sakemi et al. | 427/523 |

*Primary Examiner*—Bruce Breneman
*Assistant Examiner*—Enh Fieler
*Attorney, Agent, or Firm*—Burns, Doane, Swecker & Mathis, LLP

[57] ABSTRACT

A plasma beam is directed towards a hearth to flow electric current of the plasma through the hearth during formation of a thin film on a substrate. The plasma beam is directed towards an auxiliary anode to flow electric current of the plasma through the auxiliary anode during the period after completion of the formation of the thin film on the substrate and before beginning of the formation of a thin film on the subsequent substrate.

2 Claims, 3 Drawing Sheets

ION PLATING APPARATUS THAT PREVENTS WASTEFUL CONSUMPTION OF EVAPORATION MATERIAL

BACKGROUND OF THE INVENTION

The present invention relates to an ion plating apparatus using plasma and an operation method for operating such an apparatus.

Typical ion plating apparatuses are known to use a pressure gradient plasma source using arc discharge or an HCD plasma source. An ion plating apparatus comprises a plasma beam generator (plasma source). A plasma beam is generated between the plasma beam generator and a hearth (anode) placed in a vacuum chamber. The plasma beam travels into the evaporation material on the hearth to evaporate the evaporation material. Metal particles evaporated from the evaporation material are ionized and activated by the plasma beam. The ionized metal particles are deposited on a surface of a substrate placed in the vacuum chamber at a predetermined amount with being opposed to the hearth. As a result, a thin film is formed on the substrate.

In the conventional ion plating apparatus, the substrate is transferred, on completion of process, from a predetermined position to another position by means of a conveyer device. Then, another substrate is transferred to the predetermined position by the conveyer device. The ion plating apparatus continues to produce the plasma beam while exchanging the substrates. This is for a stable operation of the apparatus. More specifically, it takes a relatively long time for the plasma beam generator to produce a stable plasma beam after a down time. Accordingly, the plasma beam is continuously supplied to the hearth, evaporating the evaporation material, during the travel of the substrates. More evaporation material is evaporated when it is a sublimation material such as indium oxide doped with tin oxide (ITO). This means the evaporation material is wasted. In addition, the ionized metal particles are deposited on the inner surface or other members of the vacuum chamber. It is thus necessary to maintain the vacuum chamber more frequently to remove the depositions on the inner surface and other members of the vacuum chamber. It is particularly significant when the plasma beam generator used is a highly effective one or high-power plasma beam generator.

SUMMARY OF THE INVENTION

Therefore, an object of the present invention is to provide an ion plating apparatus that prevents a plasma beam from reaching a hearth during the exchange of substrates even if the plasma beam is continuously generated.

Another object of the present invention is to provide an operation method for operating an ion plating apparatus that prevents wasteful consumption of the evaporation material.

An ion plating apparatus according to the present invention comprises a vacuum chamber having a plasma beam generator, a hearth which serves as an anode and is placed within the vacuum chamber, and an auxiliary anode disposed around the hearth. The plasma beam generated by the plasma beam generator is led into the hearth to evaporate and ionize evaporation material provided on the hearth. The ionized evaporated particles are deposited on a surface of a substrate placed in opposition to the hearth to form a thin film of the evaporation material on the substrate.

According to an aspect of the present invention, the ion plating apparatus further comprises means for directing the plasma beam towards the hearth to flow electric current of the plasma beam through the hearth during the formation of the thin film on the substrate, and for directing the plasma beam towards the auxiliary anode to flow the electric current of the plasma beam through the auxiliary anode during the period after completion of the formation of the thin film on the substrate and before beginning of the formation of a thin film on the subsequent substrate.

DESCRIPTION OF THE PREFERRED EMBODIMENT

Figure 1:
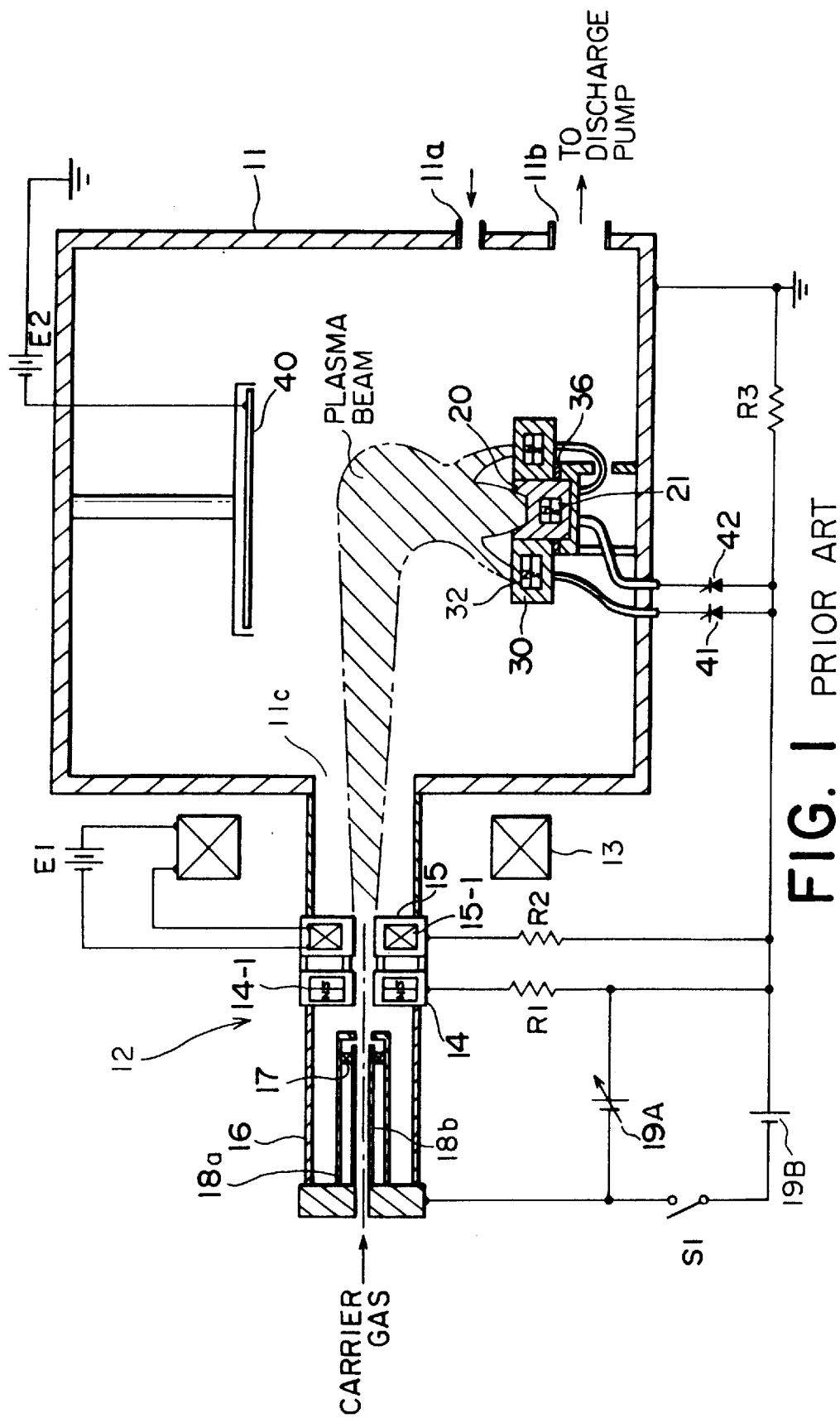
FIG. 1 is a vertical sectional view showing an example of an ion plating apparatus in which the present invention is applied.
Figure 2:
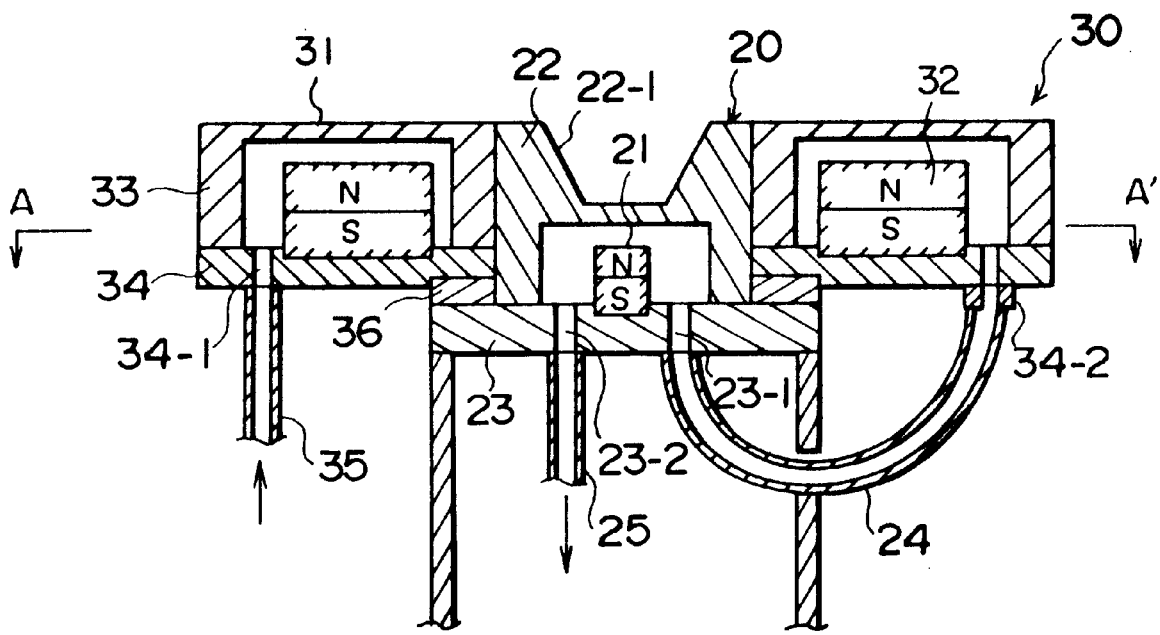
FIG. 2 is a vertical sectional view showing a hearth, an auxiliary anode, and associated peripheral components shown in FIG. 1.

Referring to FIGS. 1 and 2, a conventional ion plating apparatus is described for the purpose of facilitating the understanding of the present invention. In FIG. 1, the ion plating apparatus comprises a vacuum chamber 11. An inlet 11a and an outlet 11b for an argon (Ar) gas and so on are formed in the side wall of the vacuum chamber 11. The inlet 11a is connected to a gas source (not shown) while the outlet 11b is connected to an exhaust pump (not shown). An opening 11c is also formed in the side wall of the vacuum chamber 11. A pressure gradient plasma beam generator 12 is provided in the opening 11c. A steering coil 13 is provided for a plasma beam guide around the outer surface of the opening 11c.

The plasma beam generator 12 has first and second intermediate electrodes 14 and 15 for the convergence of the plasma beam. The first and the second intermediate electrodes 14 and 15 are placed in a concentric manner. The first intermediate electrode 14 has a permanent magnet 14-1 provided therein. The pole axis of the permanent magnet 14-1 is parallel to the central axis of the plasma beam generator 12. On the other hand, the second intermediate electrode 15 has a coil 15-1 provided therein. The plasma beam generator 12 has an insulating tube (glass tube) 16. A circular plate 17 is provided within the insulating tube 16. The circular plate 17 is made of $LaB_6$. In addition, a cylinder 18a and a pipe 18b are also provided within the insulating tube 16. The cylinder 18a is formed of molybdenum (Mo) into which a carrier gas can be introduced and the pipe 18b is formed of tantalum (Ta).

A main power supply 19A is connected between a body of the plasma beam generator 12 and the first intermediate electrode 14 through a resistor R1. The main power supply 19A is in parallel with the serial connection of a switch S1 and an auxiliary discharge power supply 19B. A common junction on the positive electrode side of the main power supply 19A and the auxiliary discharge power supply 19B is connected to the second intermediate electrode 15 through a resistor R2. The common junction is grounded through a resistor R3 and is connected to the body of the vacuum chamber 11. The coil 15-1 in the second intermediate electrode 15 is connected to a first direct current source E1 for magnetization along with the steering coil 13.

A hearth 20 is placed in the vacuum chamber 11 to serve as an anode. A substrate 40 to be processed is opposed to and positioned over the hearth 20. A direct current source E2 for the negative biasing is connected to the substrate 40.

The substrates 40 are intermittently transferred to an illustrated predetermined position in the vacuum chamber 11 by means of a conveyer device which is not shown. This allows the ion plating apparatus to operate continuously. The conveyer device is well known in the art and thus illustration and description thereof are omitted.

An auxiliary anode 30 is provided around the hearth 20. In FIG. 2, the auxiliary anode 30 is combined with a water cooling system. The hearth 20 has a permanent magnet 21, an upper plate 22, and a lower plate 23. The pole axis of the permanent magnet is along the vertical direction. A concave section 22-1 is formed in the top surface of the upper plate 22 to receive the evaporation material. A reception gap is kept below the upper plate 22 in which the reception gap is considerably larger than the permanent magnet 21. The lower plate 23 is secured to the lower end of the upper plate 22. Thus a water cooling space is formed within the hearth 20. The lower plate 23 has a water inlet 23-1 and a water outlet 23-2.

The auxiliary anode 30 is formed of a circular magnet case 31 and a circular permanent magnet 32 provided in the magnet case 31. The magnet case 31 is arranged around the hearth 20 at a predetermined gap from the hearth 20 to hold the circular permanent magnet 32 slightly above the permanent magnet 21. The permanent magnet 32 is concentric with the hearth 20, surrounding around the upper portion of the hearth 20 with the pole axis being in the vertical direction. The magnet case 31 has a circular upper case 33 and a circular lower case 34. The upper case 33 has a reception space that is considerably larger than the permanent magnet 32. The lower case 34 is secured to the bottom surface of the upper case 33. Thus the water cooling space is also formed within the magnet case 31. The lower case 34 also has a water inlet 34-1 and a water outlet 34-2.

In this example, the common water cooling system is used for both the hearth 20 and the auxiliary anode 30. Therefore, cooling water is introduced from a pipe 35 to the auxiliary anode 30 through the water inlet 34-1. The cooling water introduced into the auxiliary anode 30 is then flown into the hearth 20 through a pipe 24 connecting the water outlet 34-2 and the water inlet 23-1. The cooling water in the hearth 20 is then drained through a pipe 25 connected to the water outlet 23-2.

The upper and the lower plates 22 and 23 forming the hearth 20 as well as the upper and the lower cases 33 and 34 forming the magnet case 32 may be made of an electrically conductive material having high thermal conductivity, such as copper, as in the hearth 20. An electric insulation plate 36 is intervened at the junction between the lower plate 23 and the lower case 34. In this example, insulation between the hearth 20 and the auxiliary anode 30 is achieved by the insulation plate 36 on the bottom side of the hearth 20. On the other hand, the electric insulation is achieved by means of providing a predetermined gap between the hearth 20 and the auxiliary anode 30 on the side of the inner wall of the predetermined gap. The permanent magnet 21 in the hearth 20 is used for the plasma beam guide but may be eliminated. With the switch S1 being on and the auxiliary discharge supply 19B being on, the discharge begins. The auxiliary discharge supply 19B is a high voltage, small current power supply. Next, a current control device 41 on the side of the auxiliary anode 30 is turned on and a current control device 42 on the side of the hearth 20 is kept off. In such a case, the discharge begins between the first intermediate electrode 14 and the cylinder 18a. Electric current of the plasma beam flows through the auxiliary anode 30, which contributes to stabilizing the plasma. The electric current through the main power supply (a low voltage, large current power supply) 19A is gradually increased from the point where the plasma is stabilized, i.e., from the point of zero current, to turn off the switch S1. The main power supply 19A is a low voltage, large current power supply. Subsequently, the current control device 41 on the side of the auxiliary anode 30 is turned off, and the current control device 42 on the side of the hearth 20 is turned on, to perform ion plating operation.

In the conventional ion plating apparatus, the substrate 40 is transferred, on completion of process, from the illustrated predetermined position to another position by means of a conveyer device. Then, another substrate is transferred to the predetermined position by the conveyer device. The ion plating apparatus continues to produce the plasma beam while exchanging the substrates. This is for a stable operation of the apparatus. More specifically, it takes a relatively long time for the plasma beam generator to produce a stable plasma beam after a down time. Accordingly, the plasma beam is continuously supplied to the hearth, evaporating the evaporation material, during the travel of the substrates. More evaporation material is evaporated when it is a sublimation material such as indium oxide doped with tin oxide (ITO). This means the evaporation material is wasted. In addition, the ionized metal particles are deposited on the inner surface or other members of the vacuum chamber. It is thus necessary to maintain the vacuum chamber more frequently to remove the depositions on the inner surface and other members of the vacuum chamber. It is particularly significant when the plasma beam generator used is a highly effective one or high-power plasma beam generator.

Figure 3:
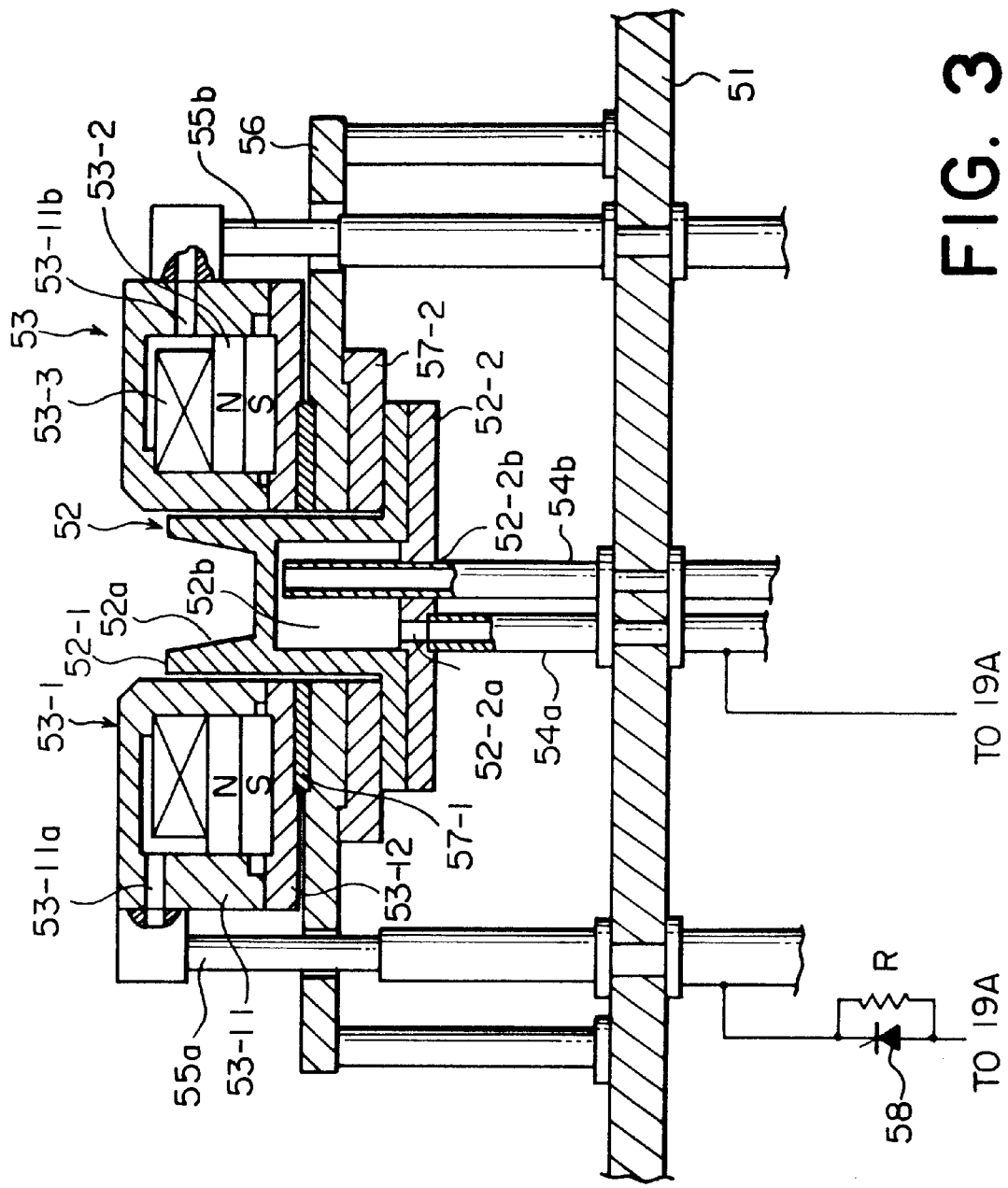
FIG. 3 is a vertical sectional view showing a hearth, an auxiliary anode, and associated peripheral components in an ion plating apparatus according to an embodiment of the present invention.

Referring to FIG. 3, an ion plating apparatus according to a preferred embodiment of the present invention is described. A feature of this embodiment lies in an electrical connection between a hearth 52, an auxiliary anode 53, and a discharge power supply. Description herein is made in a different way from the hearth 20, the auxiliary anode 30, and the connection circuit for the discharge power supply, described in conjunction with FIG. 1. However, the operation method of the present invention can equally be applied to the ion plating apparatus shown in FIG. 1.

The hearth 52 and the auxiliary anode 53 are separately combined with a water cooling system. The hearth 52 is formed of an upper plate 52-1 and a lower plate 52-2. A concave section 52-1 is formed in the top surface of the upper plate 52 to receive the evaporation material. A hollow space is formed in the lower section where a flange is provided. The lower plate 52-2 is secured to the flange of the upper plate 52-1. A water cooling space 52b is formed between the upper and the lower plates 52-1 and 52-2. The lower plate 52-2 has an inlet 52-2a and an outlet 52-2b. The inlet and the outlet 52-2a and 52-2b are connected to pipes 54a and 54b, respectively, for the circulation of the cooling water.

The auxiliary anode 53 has a hollow circular magnet case 53-1. The circular magnet case 53-1 is concentric with the hearth 52 and surrounds the upper portion of the hearth 52. A circular permanent magnet 53-2 and a coil 53-3 are formed in the circular magnet case 53-1. The pole axis of the circular permanent magnet 53-2 is in the vertical direction. The coil 53-3 is for easier guidance of the plasma beam into the hearth 52 in cooperation with the circular permanent magnet 53-2. The circular magnet case 53-1 has a circular upper case 53-11 and a circular lower case 53-12. The circular permanent magnet 53-2 and the coil 53-3 are received and a water cooling gap is formed in the space between the upper and the lower cases 53-11 and 53-12. In this way, the water cooling space is also formed within the circular magnet case 53-1. The upper case 53-11 has an inlet 53-11a and an outlet 53-11b formed therein. The inlet and the outlet 53-11a and 53-11b are connected to pipes 55a and 55b, respectively, for the circulation of the cooling water.

The upper and the lower plates 52-1 and 52-2 forming the hearth 52 as well as the upper and the lower cases 53-11 and 53-12 forming the circular magnet case 53-1 may be made of an electrically conductive material having high thermal conductivity, such as copper, as in the hearth 52. The auxiliary anode 53 is supported by a rack 56. An electric insulating plate 57-1 is intervened between the rack 56 and the lower case 53-12. A predetermined gap is formed where no portion of the insulating plate 57-1 is present. An insulating plate 57-2 is intervened between the rack 56 and the flange of the upper plate 52-1. The hearth 52 is insulated from the auxiliary electrode 53 by means of forming a predetermined gap therebetween. However, the insulation may be achieved with a cylindrical insulating material.

Pipes 54a, 54b, 55a, and 55b are made of a metal and are lead out of the vacuum chamber 51 with being insulated from the vacuum chamber 51. Therefore, the pipes 54a and 54b are electrically conducted with the hearth 52. The pipes 55a and 55b are electrically conducted with the auxiliary anode 53. The pipe 54a is directly connected to the positive side of the main power supply 19A shown in FIG. 1. On the other hand, the pipe 55a is directly connected to the positive side of the main power supply 19A through a parallel circuit of a conducting state control element 58 such as thyristor and a high resistor R.

The ion plating apparatus according to the present invention directs the plasma beam towards the hearth 52 to flow the electric current of the plasma beam through the hearth 52. It also directs the plasma beam into the auxiliary anode 53 to flow the electric current of the plasma beam through the auxiliary anode 53 during the period after completion of the ion plating on the substrate and before beginning of the ion plating of a thin film on the subsequent substrate.

More specifically, the conducting state control element 58 is kept off during the ion plating to a substrate. The conducting state control element 58 is turned on during the period after completion of the ion plating on the substrate and before beginning of the ion plating of a thin film on the subsequent substrate. With this configuration, the plasma beam is directed to the hearth 52 to enhance the evaporation of the evaporation material when the conducting state control element 58 is off. However, the plasma beam is attracted towards the auxiliary anode 53 and hardly reaches the hearth 52 when the conducting state control element 58 is turned on. As a result, evaporation of the evaporation material is inhibited.

As described above, the position where the plasma beam reaches can be changed merely by means of turning on or off the conducting state control element 58. The reason is as follows. The auxiliary anode 53 has a larger top surface than the hearth 52 does, so that the plasma beam is more likely to be attracted by the auxiliary anode 53. Therefore, the plasma beam is directed towards the auxiliary anode 53 only by means of turning on the conducting state control element 58 without providing a conducting state control element on the line for the hearth 52.

A portion of the plasma beam is directed to the hearth 52 but it has less or no effect on the evaporation of the evaporation material. If it affects, the conducting state control element may be provided in the circuit for the hearth 52.

According to the present invention, wasteful evaporation of the evaporation material can be eliminated because the evaporation of the evaporation material is restricted during the exchange of the substrates. As a result, the amount of the evaporation material deposited on the inner surface and other components of the vacuum chamber is reduced, which in turn reduces the time for maintain the vacuum chamber by eliminating the depositions. In other words, the vacuum chamber requires maintenance less frequently.

What is claimed is:

1. A method for operating an ion plating apparatus comprising a vacuum chamber having a plasma beam generator, a hearth which serves as an anode and is placed within said vacuum chamber, and an auxiliary anode disposed around said hearth, a plasma beam generated by said plasma beam generator being led into said hearth to evaporate and ionize evaporation material provided on said hearth, the ionized evaporated particles being deposited on a surface of a substrate placed in opposition to said hearth to form a thin film of the evaporation material on the substrate, the method comprising:

directing the plasma beam towards the hearth to flow electric current of the plasma through the hearth during formation of the thin film on the substrate, and directing the plasma beam towards the auxiliary anode to flow electric current of the plasma through the auxiliary anode during the period from completion of the formation of the thin film on the substrate to a beginning of the formation of a thin film on the subsequent substrate.

2. A method for operating an ion plating apparatus comprising a vacuum chamber having a plasma beam generator, a hearth which serves as an anode and is placed within said vacuum chamber, and an auxiliary anode disposed around said hearth, a plasma beam generated by said plasma beam generator being led into said hearth to evaporate and ionize evaporation material provided on said hearth, the ionized evaporated particles being deposited on a surface of a substrate placed in opposition to said hearth to form a thin film of the evaporation material on the substrate, the method comprising:

directing the plasma beam towards the hearth to flow electric current of the plasma through the hearth during formation of the thin film on the substrate, and directing the plasma beam towards the auxiliary anode to flow electric current of the plasma through the auxiliary anode during the period when the formation of the thin film on the substrate is not appropriate and before beginning of a subsequent formation of a thin film.

* * * * *